(12) United States Patent
Takasou

(10) Patent No.: US 7,606,027 B2
(45) Date of Patent: Oct. 20, 2009

(54) ELECTRONIC APPARATUS COOLING STRUCTURE

(75) Inventor: Kazuo Takasou, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/000,207

(22) Filed: Dec. 11, 2007

(65) Prior Publication Data

US 2008/0151501 A1 Jun. 26, 2008

(30) Foreign Application Priority Data

Dec. 21, 2006 (JP) ............................. 2006-344502

(51) Int. Cl.
*H05K 7/20* (2006.01)
*F28F 7/00* (2006.01)

(52) U.S. Cl. ................. 361/695; 165/80.2; 165/80.3; 165/185; 165/122; 361/694; 361/703

(58) Field of Classification Search ......... 361/694–695, 361/700, 703
See application file for complete search history.

(56) References Cited

U.S. PATENT DOCUMENTS

| | | | |
|---|---|---|---|
| 5,940,272 A | 8/1999 | Emori et al. | |
| 6,065,530 A * | 5/2000 | Austin et al. | 165/80.3 |
| 6,219,236 B1 * | 4/2001 | Hirano et al. | 361/695 |
| 6,348,748 B1 * | 2/2002 | Yamamoto | 310/62 |
| 6,365,964 B1 * | 4/2002 | Koors et al. | 257/718 |
| 6,466,441 B1 * | 10/2002 | Suzuki | 361/695 |
| 6,529,375 B2 * | 3/2003 | Miyahara et al. | 361/697 |
| 6,657,860 B2 * | 12/2003 | Matsui et al. | 361/695 |
| 6,847,524 B2 | 1/2005 | Tomioka et al. | |
| 7,130,191 B2 * | 10/2006 | Lin et al. | 361/695 |
| 2005/0057899 A1 | 3/2005 | Lord | |
| 2005/0146851 A1 | 7/2005 | Kajiura | |
| 2006/0144573 A1 * | 7/2006 | Nitta et al. | 165/104.33 |

FOREIGN PATENT DOCUMENTS

| | | |
|---|---|---|
| DE | 37 10 198 C2 | 10/1988 |
| DE | 20 2004 003 793 U1 | 6/2004 |
| DE | 102 56 343 B3 | 8/2004 |
| JP | 08-186388 A | 7/1996 |
| JP | 2006-332377 A | 12/2006 |

OTHER PUBLICATIONS

Office Action dated Feb. 13, 2009 in corresponding German patent application No. 10 2007 058 706.8-34 (and English translation).

* cited by examiner

*Primary Examiner*—Gregory D Thompson
(74) *Attorney, Agent, or Firm*—Posz Law Group, PLC

(57) ABSTRACT

An electronic apparatus includes a circuit board, circuit elements mounted on the circuit board, and a cooling structure for cooling the circuit elements. The circuit elements include a heat generating element. The cooling structure includes a heat spreader, cooling fins integrally formed with the heat spreader, an air inlet, an air outlet, and a fan device for generating cooling air flowing from the air inlet to the air outlet. The heat spreader is placed above the circuit board and thermally joined to the heat generating element mounted on the circuit board. The cooling fins extend toward the circuit board to provide a plurality of air passages between the circuit board and the heat spreader. The air inlet and outlet communicate with each other through the air passages.

8 Claims, 3 Drawing Sheets

ELECTRONIC APPARATUS COOLING STRUCTURE

CROSS REFERENCE TO RELATED APPLICATION

This application is based on and incorporates herein by reference Japanese Patent Application No. 2006-344502 filed on Dec. 21, 2006.

FIELD OF THE INVENTION

The present invention relates to an electronic apparatus having a cooling structure including a heat spreader and a fan device to cool a heat generating element mounted on a circuit board.

BACKGROUND OF THE INVENTION

Typically, a vehicle navigation apparatus includes a board called a navigation board. The navigation board is constructed such that a central processing unit (CPU) and peripheral components such as a memory device and a high-frequency element are mounted on a circuit board. The navigation board is mounted in a case together with other devices such as a hard disk drive.

A vehicle navigation apparatus is installed in a vehicle, where the temperature becomes relatively high. In recent years, a vehicle navigation apparatus has become increasingly sophisticated, i.e., a CPU used in the vehicle navigation apparatus become increasingly sophisticated. Accordingly, the amount of heat generated by a CPU has increased. Therefore, a cooling structure for cooling a CPU and peripheral components has become important.

For example, as disclosed in U.S. Pat. No. 6,847,524 corresponding to JP-A-2002-368467, a laptop computer cooling structure has been proposed that includes a heat spreader (i.e., heat sink), cooling fins integrated with the heat spreader, and a fan device for supplying air between the cooling fins. The heat spreader is placed above a circuit board on which a heat generating semiconductor package (i.e., CPU) is mounted. The heat spreader thermally contacts the heat generating semiconductor package.

As shown in FIG. 3, the inventor has applied such a laptop computer cooling structure to a cooling structure for cooling a navigation board. A CPU 2 as a heat generating device and a plurality of circuit elements 3 (peripheral components) are mounted on a circuit board 1. A heat spreader 4 shaped like a plate and made of aluminum is placed above the circuit board 1. A contact portion 5 is integrally formed on a bottom surface of the heat spreader 4 and thermally contacts the CPU 2.

A plurality of cooling fins 6 is integrally formed on a top surface of the heat is placed at the heat spreader 4 and extends in the right and left direction in FIG. 3. A rid 8 such as a metal plate is placed above the cooling fins 6 so that air passages are provided between the cooling fins 6. A fan device 7 is placed at the right corner portion of FIG. 3. As indicated by arrows of FIG. 3, when the fan device 7 is driven, air is withdrawn into the air passages from above, and the air flows through the air passages from left to right in FIG. 3. Thus, heat generated by the CPU 2 is dissipated through the cooling fins 6.

Such a conventional cooling structure is focused on cooling the CPU2, i.e., dissipating heat generated by the CPU2. In short, in the conventional cooling structure, cooling of the circuit elements 3 is not taken into consideration. However, some of the circuit elements 3 have guaranteed temperatures less than that of the CPU 2. Therefore, when the amount of heat generated by the CPU 2 is significantly increased, for example, as a result of sophistication, an ambient temperature of the circuit elements 3 may exceed the guaranteed temperatures of the circuit elements 3.

For example, it is assumed that a guaranteed surface temperature of the CPU 2 is 100 degrees Celsius (° C.), and a guaranteed ambient temperature of the circuit elements 3 is 85° C. In this case, the bottom surface of the heat spreader 4 is required to be cooled below 100° C. For example, the heat spreader 4 is designed so that the bottom surface of the heat spreader 4 is cooled to 95° C. In this case, a heat generating member of 95° C. is located above the whole circuit board 1. As a result, the ambient temperature of the circuit elements 3 may exceed 85° C., which is the guaranteed ambient temperature of the circuit elements 3.

The ambient temperature of the circuit elements 3 can be reduced below the guaranteed ambient temperature of the circuit elements 3 by increasing cooling performance of the heat spreader 4. One approach to increase the cooling performance of the heat spreader 4 is to increase size of the hear spreader 4. However, the increase in size of the hear spreader 4 results in increases in size and cost of the cooling structure. Further the cooling structure shown in FIG. 3 requires the rid 8, which increases the size and cost of the cooling structure.

SUMMARY OF THE INVENTION

In view of the above-described problem, it is an object of the present invention to provide an electronic apparatus having a cooling structure that efficiently cools not only a heat generating element mounted an a circuit board but also a peripheral element mounted on the circuit board.

An electronic apparatus includes a circuit board, a plurality of circuit elements mounted on the circuit board, and a cooling structure for cooling the circuit elements. The circuit elements includes a heat generating element. The cooling structure includes a heat spreader, a plurality of cooling fins integrally formed with the heat spreader, an air inlet, an air outlet, and a fan device for generating air flowing from the air inlet to the air outlet.

The heat spreader is placed above the circuit board and thermally joined to the heat generating element mounted on the circuit board. The cooling fins extend toward the circuit board to provide a plurality of air passages between the circuit board and the heat spreader The air inlet and outlet communicate with each other through the plurality of air passages.

According to the cooling structure, when the fan device is driven, the cooling air flows through the air passages, which are respectively separated by the cooling fins and provided between the heat spreader and the top surface of the circuit board. Heat generated by the heat generating element dissipates into the cooling air through the cooling fins, and the cooling air having the heat is discharged from the air outlet. Further, the cooling air directly contacts the heat generating element, the circuit elements other than the heat generating element, and the top surface of the circuit board. Thus, the cooling structure has an improved cooling capacitance. The cooling fins extend toward the circuit board so that the cooling structure can have a small size.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENT

Figure 1:
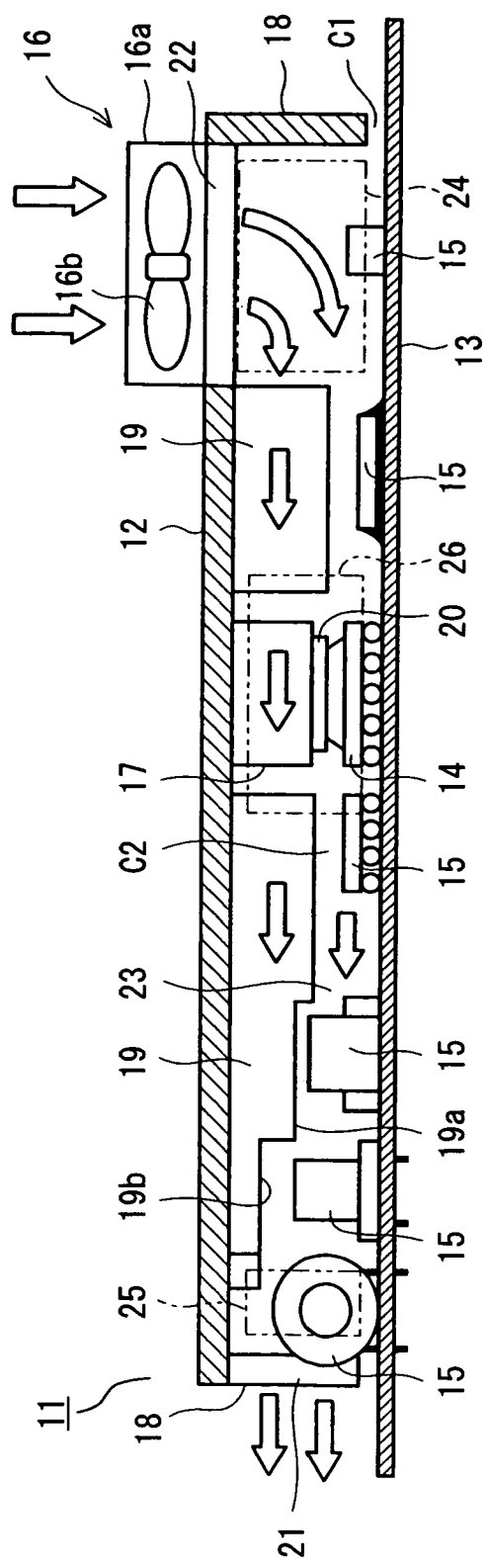
FIG. 1 is a diagram illustrating a cross-sectional view of an navigation board having a cooling structure according to an embodiment of the present invention.

A navigation board 11 as an electronic apparatus having a cooling structure according to an embodiment of the present invention is illustrated in FIG. 1. Although not shown in the drawings, the navigation board 11 is mounted inside a case together with a plurality of devices to construct a main unit of a vehicle navigation apparatus. For example, the devices can include a hard disk drive, a DVD drive, and other circuit boards (e.g., audio board).

As shown in FIG. 1, the navigation board 11 includes a rectangular printed circuit board 13, a central processing unit (CPU) 14 mounted on a top surface of the board 13, and a plurality of circuit elements (i.e., peripheral elements) 15 mounted on the top surface of the board 13. The length of the board 13 is greater than the width of the board 13. The CPU 14 is mounted substantially in the center of the board 13.

The circuit elements 15 include a semiconductor element (e.g., memory element). The semiconductor element is of a thin small outline package (TSOP) type, a chip scale package (CSP) type, or the like. The semiconductor element is arranged near the CPU 14. In addition to the semiconductor element, the circuit elements 15 include a power element, a capacitor, a coil, and the like. The power element, the capacitor, and the coil are arranged on the left side of the board 13 in FIG. 1. Specifically, the circuit elements 15 arranged on the left side of the board 13 have a height greater than that of the circuit elements 15 arranged on the middle or the right side of the board 13 in FIG. 1. Thus, the circuit elements 15 having relatively large heights are collectively mounted on the left side of the board 13 in FIG. 1. The CPU 14 is a heat generating element, and the amount of heat generated by the CPU 14 is greater than the amount of heat generated by each circuit element 15.

The navigation board 11 has a cooling structure including a heat spreader 12 and a fan device 16. The heat spreader 12 and the fan device 16 are placed above the board 13. The heat spreader 12 has a rectangular plate-like shape and slightly smaller in size than the board 13. The heat spreader 12 may be, for example, made from aluminum. The heat spreader 12 is provided with a contact portion 17, a shield wall 18, and a cooling fin 19. The contact portion 17, the shield wall 18, and the cooling fin 19 are integrally formed with a bottom surface of the heat spreader 12 to face the top surface of the board 13. The contact portion 17 thermally contacts the CPU 14 mounted on the top surface of the board 13. Although not shown in the drawings, the heat spreader 12 is provided with a mounting portion (e.g., a screw hole) on edges and is fixed to the board 13 at the mounting portion by a screw, for example.

The contact portion 17 has a cylindrical shape and is placed substantially in the center of the heat spreader 12 to face the CPU 14. The contact portion 17 extends toward the top surface of the board 13 and thermally contacts the CPU 14. As shown in FIG. 1, a heat conductive gel 20 is applied to a bottom surface of the contact portion 17. Thus, the bottom surface of the contact portion 17 and a top surface of the CPU 14 can be thermally joined together through the heat conductive gel 20.

Figure 2:
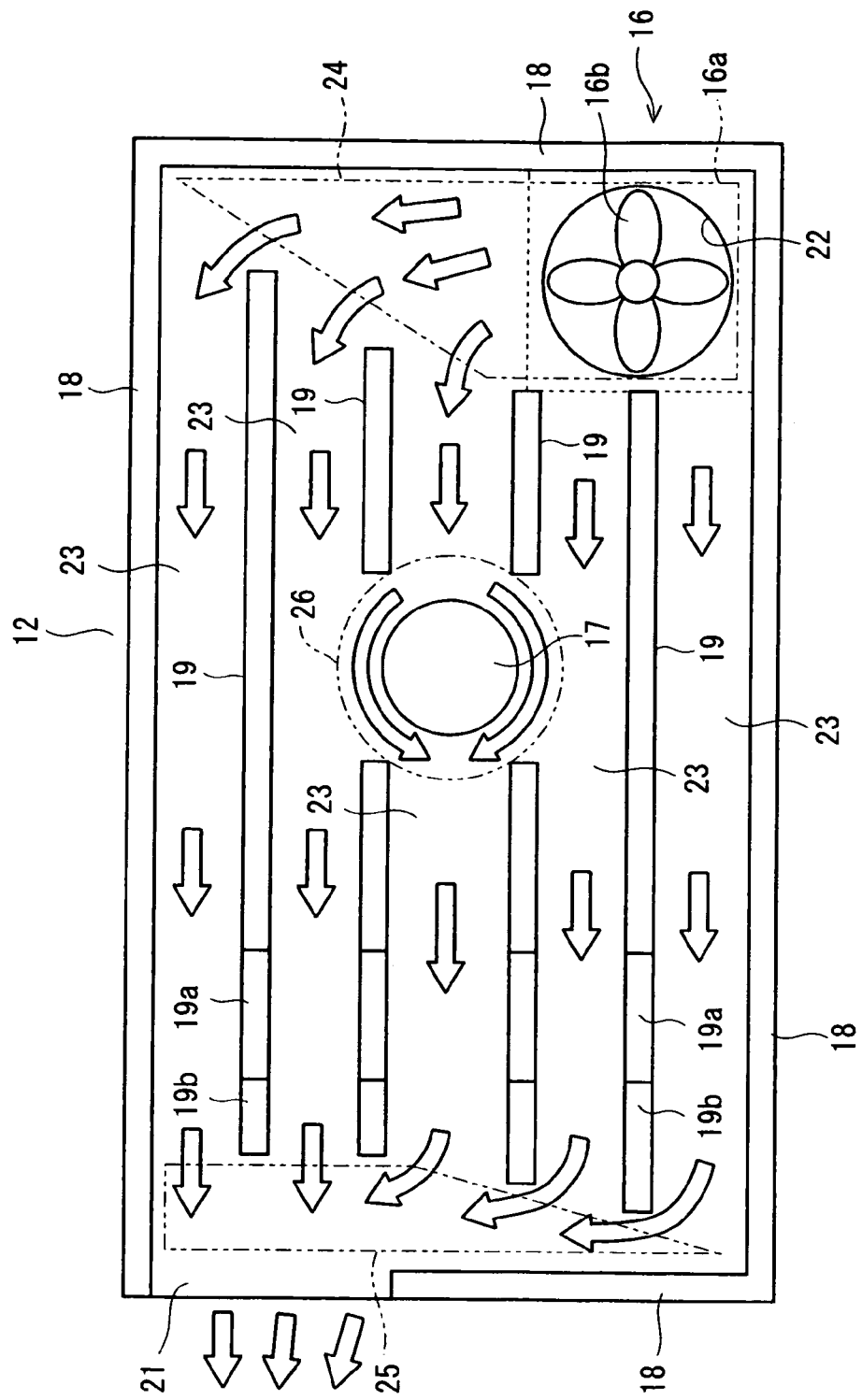
FIG. 2 is a diagram illustrating a bottom view of a heat spreader of the cooling structure.

As shown in FIG. 2 illustrating the bottom view of the heat spreader 12, the shield wall 18 is placed around the perimeter of the heat spreader 12 and extends toward the top surface of the board 13. The shield wall 18 has a cutout portion at the left-top side in FIG. 2. The cutout portion serves as an air outlet 21. As shown in FIG. 1, a constant clearance C1 of about between 0.5 millimeters (mm) and 1 mm is provided between a bottom surface of the shield wall 18 and the top surface of the board 13.

The heat spreader 12 has a circular air inlet 22 at the right-bottom corner in FIG. 2. The fan device 16 is placed above the air inlet 22 to cover the air inlet 22. The fan device 16 has a rectangular outer shape. The fan device 16 includes a casing 16a, a blade 16b, and a motor (not shown). The casing 16a has a circular opening communicating with the air inlet 22 of the heat spreader 12. When the blade 16b is driven (i.e., rotated) by the motor, cooling air is drawn into space between the heat spreader 12 and the board 13 from outside through the air inlet 22.

In FIG. 1, the cooling fin 19 extends in a downward direction toward the top surface of the board 13. The cooling fin 19 also extends in a side-to-side direction in FIG. 1. In the present embodiment, the heat spreader 12 is provided with four cooling fins 19 arranged in parallel rows. Thus, five air passages 23 respectively separated by the four cooling fins 19 are provided in the space between the bottom surface of the heat spreader 12 and the top surface of the board 13.

As shown in FIG. 2, the cooling fins 19 are not placed in a rectangular region directly below the fan device 16. Also, the cooling fins 19 are not placed in a triangular region in front of the rectangular region. Thus, a first trapezoidal region formed by the rectangular and triangular regions is provided on the side of the air inlet 22. The first trapezoidal region serves as an inlet pressure room 24 through which the air introduced through the air inlet 22 is distributed between the air passages 23. Likewise, a second trapezoidal region, where the cooling fins 19 are not placed, is provided on the side of the air outlet 21. The second trapezoidal region serves as an outlet pressure room 25. The air passing through the air passages 23 gathers into the outlet pressure room 25 and are discharged to outside through the air outlet 21. In the present embodiment, for example, the outlet pressure room 25 has a width less than that of the inlet pressure room 24. Further, each of the two center cooling fins 19 is divided in two so that a ring space 26 is formed around the contact portion 17.

As shown in FIG. 1, the cooling fins 19 have steps 19a, 19b that adjust the length of the cooling fins 19 from the bottom surface of the heat spreader 12. Thus, the steps 19a, 19b allow a predetermined clearance C2 to remain between the cooling fins 19 and the circuit elements 15 mounted on the board 13. As described previously, in FIG. 1, the circuit elements 15 arranged on the left side of the board 13 have the height greater than that of the circuit elements 15 arranged on the middle or the right side of the board 13. Therefore, the length of the cooling fins 19 arranged on the left side is less than that of the cooling fins 19 arranged on the middle or the right side. Specifically, whereas the length of the cooling fins 19 arranged on the middle or the right side is constant, the length of the cooling fins 19 arranged on the left side is adjusted by the steps 19a, 19b according to the height of the circuit elements 15. In the present embodiment, the clearance C2 is set greater than the clearance C1 and between 1 mm and 2 mm, for example.

The cooling structure according to the present embodiment has the following effect and advantage. As indicated by arrows of FIGS. 1, 2, when the fan device 16 is driven, the cooling air is withdrawn into the inlet pressure room 24 through the air inlet 22. Then, the air flows from left to light in FIGS. 1, 2 through the air passages 23 respectively separated by the cooling fins 19. The air is introduced from the inlet pressure room 24 into the air passages 23 by an even pressure to be evenly distributed between the air passages 23. Thus, the air spreads among all the air passages 23.

The air passing through the air passages 23 gathers into the outlet pressure room 25 and is discharged to outside through the air outlet 21. The contact portion 17 thermally contacting the CPU 14 is placed in the air passages 23 so that the air can flow around the contact portion 17, i.e., the CPU 14. Further, since the contact portion 17 is cylindrical, the air can smoothly pass through the air passages 23 without being obstructed by the contact portion 17. Thus, the contact portion 17 and the CPU 14 can be efficiently cooled by the air passing through the air passages 23. Furthermore, the shield wall 18 placed around the perimeter of the heat spreader 12 helps prevent the air from leaking out of the air passages 23. The present inventor has verified by experiment that leakage of the air can be negligible when the clearance C1 is 1 mm.

Whereas the air introduced in the navigation board 11 flows in the above-described manner, heat generated by the CPU 14 flows in the following manner. The heat is transmitted from the CPU 14 to the contact portion 17 of the heat spreader 12 through the heat conductive gel 20. As a result, the heat spreads over the heat spreader 12, and the temperature of the heat spreader 12 and the cooling fins 19 increases. Heat exchange occurs between the cooling fins 19 and the air flowing through the air passages 23. Thus, the heat efficiently dissipates from the cooling fins 19 into the air, and the air heated by the heat exchange is discharged from the air outlet 21.

At the same time, the heat is transmitted from the CPU 14 to the board 13 through electrical junctions between the board 13 and the CPU 14. As a result, the temperatures of the board 13 and the circuit elements 15 mounted on the board 13 increase. Heat exchange occurs between the board 13 and the circuit elements 15, and the air flowing through the air passages 23. Thus, the heat efficiently dissipates from the board 13 and the circuit elements 15 into the air, and the air heated by the heat exchange is discharged from the air outlet 21. Therefore, in addition to the CPU 14, the board 13 and the circuit elements 15 can be cooled by the air. Further, since the heat spreader 12 covers substantially all over the board 13, the heat spreader 12 serves as an electromagnetic shield.

As described above, the cooling structure according to the present embodiment significantly improves a cooling performance for cooling the CPU 14. Further, the cooling structure allows ambient temperature of the circuit elements 15 to be kept low.

For example, it is assumed that a guaranteed surface temperature of the CPU 14 is 100 degrees Celsius (° C.), and a guaranteed ambient temperature of the circuit elements 15 is 85° C. In this case, the bottom surface of the heat spreader 12 is required to be cooled below 100° C. For example, the heat spreader 12 is designed so that the bottom surface of the heat spreader 12 is cooled to 95° C. In this case, a heat generating member (i.e., heat spreader 12) of 95° C. is located above the whole board 13.

According to the present embodiment, the air flows between the heat spreader 12 and the board 13 so that inlet and outlet air temperatures can be kept below 85° C. Thus, the ambient temperature of the circuit elements 15 can be kept below 85° C., which is the guaranteed ambient temperature of the circuit elements 15. Although the heat generated by the CPU 14 may be transmitted to the board 13, the air can directly contact the board 13. As a result, the board 13 and the CPU 14 are sufficiently cooled by the air so that the ambient temperature of the circuit elements 15 can be kept below the guaranteed ambient temperature of the circuit elements 15. Therefore, the temperatures of the CPU 14 and the circuit elements 15 can be kept below the respective guaranteed temperatures without increasing the size of the heat spreader 12 and without improving air supplying capacity of the fan device 16.

Figure 3:
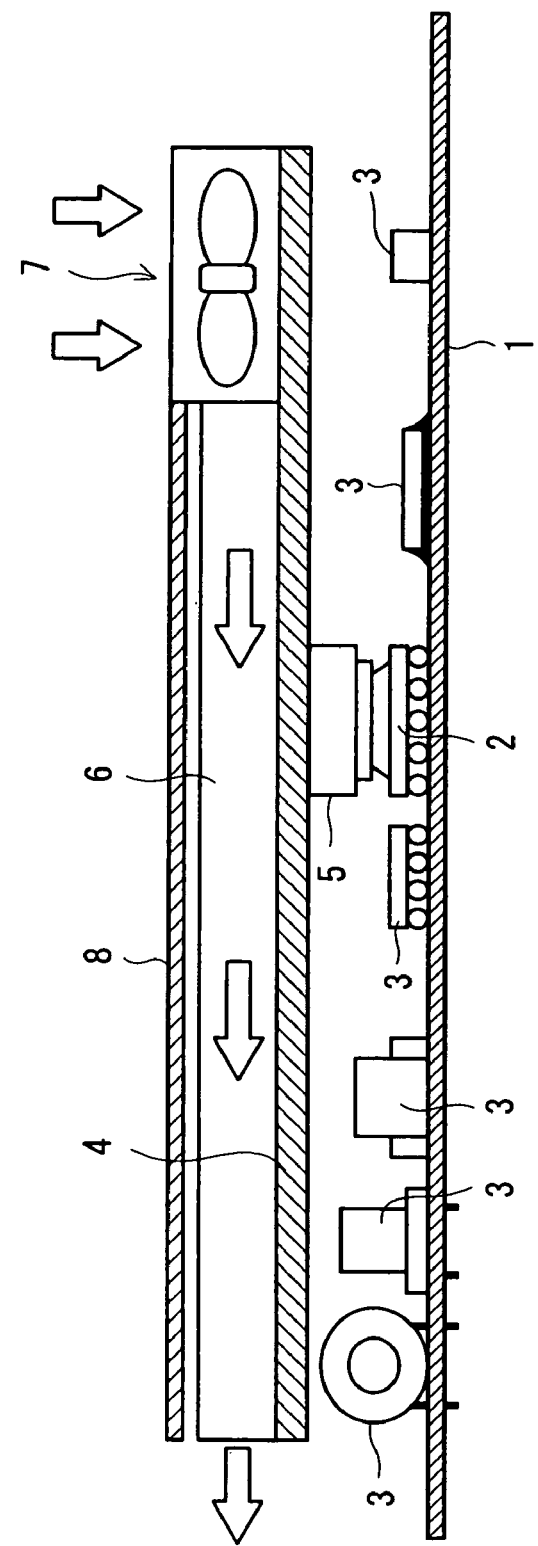
FIG. 3 is a diagram illustrating a cross-sectional view of an navigation board having a cooling structure according to a related art.

Further, the cooling fins 19 extends toward the board 13. In such an approach, an increase in size of the navigation board 11 is limited so that an increase in cost of the navigation board 11 can be limited. The cooling fins 19 have the steps 19a, 19b that allow the predetermined clearance C2 to remain between cooling fins 19 and the circuit elements 15. Thus, the whole thickness of the heat spreader 12 including the cooling fins 19 can be reduced. Unlike the related art shown in FIG. 3, the cooling structure according to the present embodiment requires no lid. Therefore, the size and cost of the navigation board 11 can be reduced.

Furthermore, the shield wall 18 is placed around the perimeter of the heat spreader 12 to help prevent the air passing through the air passages 23 to leak out. Thus, the cooling structure provides an improved cooling performance. The clearance C1 between the shield wall 18 and the board 13 is set less than the clearance C2 between the cooling fins 19 and the circuit elements 15. In such an approach, most of the air introduced inside the navigation board 11 flows through the air passages 23 without leaking out so that the cooling performance enough to kept the temperatures to the CPU 14 and the circuit elements 15 below the respective guaranteed temperatures can be ensured.

Furthermore, the inlet pressure room 24 is placed near the air inlet 22 to equally distribute the air introduced through the air inlet 22 between the air passages 23. The outlet pressure room 25 is placed near the air outlet 21 to gather the air passing through the air passages 23 so that the air can be discharged through the air outlet 21 without dispersion. The contact portion 17 thermally contacting the CPU 14 is cylindrical and the ring space 26 is formed around the contact portion 17. In such an approach, the air can smoothly pass through the air passages 23 without being obstructed by the contact portion 17. Thus, the contact portion 17 and the CPU 14 can be efficiently cooled by the air passing through the air passages 23.

(Modifications)

The embodiments described above may be modified in various ways. For example, in the embodiment described above, the fan device 16 is a blower type and arranged on the side of the air inlet 22. Alternatively, the fan device 16 may be a sucker type and arranged on the side of the air outlet 21. An additional fan device may be placed above the heat spreader 12. The contact portion 17 of the heat spreader 12 may have a shape other than the cylinder. For example, the contact portion 17 can have a prismatic shape. The contact portion 17 and the CPU 14 may be thermally joined together through a heat conductive member other than the heat conductive gel 20. For example, the contact portion 17 and the CPU 14 can be thermally joined together through a heat conductive grease or tape. The number and the arrangement of the circuit elements 14, 15, and the cooling fins 19 can be changed according to needs.

The cooling structure according to the present invention can be applied to various electronic apparatus having a heat generating element to be cooled. In particular, the cooling structure can be suitably applied to electronic apparatus used in a vehicle, where the temperature becomes high.

Such changes and modifications are to be understood as being within the scope of the present invention as defined by the appended claims.

What is claimed is:

1. An electronic apparatus comprising:
a circuit board;
a plurality of circuit elements mounted on a top surface of the circuit board, the plurality of circuit elements including a heat generating element; and
a cooling structure that includes a heat spreader, a plurality of cooling fins integrally formed with the heat spreader, an air inlet, an air outlet, and a fan device for generating cooling air flowing from the air inlet to the air outlet, wherein
the heat spreader is placed above the circuit board and thermally joined to the heat generating element mounted on the circuit board, wherein
the plurality of cooling fins extends from a bottom surface of the heat spreader toward the top surface of the circuit board to provide a plurality of air passages between the top surface of the circuit board and the bottom surface of the heat spreader, wherein
the air inlet and the air outlet communicate with each other through the plurality of air passages, wherein
a first one of the plurality of cooling fins has a first length measured from the bottom surface of the heat spreader and located above a first one of the plurality of circuit elements to provide a first clearance therebetween, the first one of the plurality of circuit elements having a first height measured from the top surface of the circuit board, wherein
a second one of the plurality of cooling fins has a second length measured from the bottom surface of the heat spreader and located above a second one of the plurality of circuit elements to provide a second clearance therebetween, the second one of the plurality of circuit elements having a second height measured from the top surface of the circuit board, wherein
the first length is greater than the second length, and wherein
the first height is less than the second height.

2. The electronic apparatus according to claim 1, wherein the cooling structure further includes a wall member placed around a perimeter of the heat spreader and extending toward the top surface of the circuit board to prevent the air from leaking out of the plurality of air passages.

3. The electronic apparatus according to claim 1, wherein the cooling structure further includes a pressure room placed near the air inlet, wherein no cooling fin is placed in the pressure room, and wherein the air is distributed between the plurality of air passages through the pressure room.

4. The electronic apparatus according to claim 1, wherein no cooling fin is placed around the heat generating element to provide a space around the heat generating element, and wherein the air flows from the air inlet to the air outlet through the space.

5. The electronic apparatus according to claim 1, wherein the heat spreader includes a contact portion having a cylindrical shape and extending toward the top surface of the circuit board to be thermally joined to the heat generating element.

6. The electronic apparatus according to claim 2, wherein the wall member has at least one of the air inlet and the air outlet.

7. The electronic apparatus according to claim 5, wherein
a first set of the plurality of cooling fins is located closer to the air inlet than the contact portion and provides a first one of the plurality of air passages, wherein
a second set of the plurality of cooling fins is located closer to the air outlet than the contact portion and provides a second one of the plurality of air passages, wherein
the first and second sets of the plurality of cooling fins are aligned with a space therebetween so that the first and second ones of the plurality of air passages are aligned with the space therebetween, and wherein
the cylindrical contact portion is located in the space not to contact with the first and second sets of the plurality of cooling fins.

8. The electronic apparatus according to claim 1, wherein the first one of the plurality of cooling fins is located closer to the air inlet than the second one of the plurality of cooling fins.

* * * * *